(12) United States Patent
Simpson et al.

(10) Patent No.: US 6,194,785 B1
(45) Date of Patent: Feb. 27, 2001

(54) METHOD FOR CIRCUITIZING THROUGH-HOLES BY PHOTO-ACTIVATED SEEDING

(75) Inventors: Logan Lloyd Simpson; Cindy Reidsema Simpson, both of Austin, TX (US); Joseph Edward Varsik, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/023,554

(22) Filed: Feb. 13, 1998

Related U.S. Application Data

(60) Division of application No. 08/764,001, filed on Dec. 12, 1996, now Pat. No. 6,087,258, which is a continuation-in-part of application No. 08/254,340, filed on Jun. 6, 1994, now abandoned.

(51) Int. Cl.$^7$ .................. H01L 23/48; H01L 23/52; H01L 29/40; H01L 21/44
(52) U.S. Cl. .................. 257/774; 257/762; 438/667; 438/674
(58) Field of Search .................. 257/762, 774, 257/784; 148/518; 228/180.5; 438/654, 667, 674, 687

(56) References Cited

U.S. PATENT DOCUMENTS

| | | | |
|---|---|---|---|
| 3,656,952 | * 4/1972 | Miller | 96/48 |
| 3,862,842 | 1/1975 | Bissonette | 96/22 |
| 4,994,434 | 2/1991 | Hung et al. | 505/1 |
| 5,275,861 | 1/1994 | Vaughn | 428/76 |
| 5,350,484 | 9/1994 | Gardner et al. | 156/628 |
| 5,462,628 | * 10/1995 | Viehbeck | 156/281 |
| 5,591,285 | 1/1997 | Afzali-Ardakani et al. | 156/62.2 |

OTHER PUBLICATIONS

Baum et al, Photoselective Catalysis of Electroless Copper Solutions for the Formation of Adherent Copper Films onto Polyimide, *Chem. Mater.*, 1991, 3, 714–720.

* cited by examiner

*Primary Examiner*—Charles Bowers
*Assistant Examiner*—Nema Berezny
(74) *Attorney, Agent, or Firm*—Pollock, Vande Sande & Amernick; Lawrence R. Fraley

(57) ABSTRACT

A method for selectively metallizing one or more through-holes, other openings (such as slots), or edges of an electronic circuit package comprising the steps of forming a layer of seeding solution on a drilled surface of a substrate of interest exposing this layer to light of appropriate wavelength, through a mask that does not completely cover the through-holes or openings and thereby results in the formation of metal seed on regions of the substrate surface corresponding to the regions of the layer of seeding solution exposed to light; removing the unexposed regions of the layer of seeding solution by subjecting the exposed and unexposed regions of the layer of seeding solution to an alkaline solution. Thereafter, additional metal is deposited, e.g., plated, onto the metal seed using conventional techniques. Significantly, this method does not involve the use of a photoresist, or of a corresponding chemical developer or photoresist stripper. Of additional significance, this method yields plated through-holes or other openings, each of which can accommodate multiple wires, rather then the traditional one wire per through-hole.

23 Claims, 1 Drawing Sheet

METHOD FOR CIRCUITIZING THROUGH-HOLES BY PHOTO-ACTIVATED SEEDING

This application is a division of application Ser. No. 08/764,001, filed Dec. 12, 1996, now U.S. Pat. No. 6,087,258 issued Jul. 11, 2000.

The preset application is a continuation in part of U.S. Ser. No. 08/254,340 filed Jun. 6, 1994, now abandoned, entitled Method for Selectively Metallizing a Substrate, which is presently on appeal to the Board of Patent Appeals and Interferences.

BACKGROUND OF THE INVENTION

1. Field of the Invention

The invention pertains to a method for circuitizing the inside of through-holes or other openings in an electronic circuit package such that the plated through-holes are personalized to permit multiple wires to pass through one drilled hole.

2. Description of the Related Art

A substrate, such as a printed circuit board substrate, is conventionally selectively metallized, e.g., an electrical circuit is formed on the substrate, by initially forming a patterned seeding layer of, for example, palladium (Pd) on a surface of the substrate. The resulting substrate is then immersed in a metal plating bath, such as an electroless copper plating bath, where the corresponding metal, e.g., copper, is selectively deposited from solution just onto the patterned seeding layer. The selectively deposited copper then constitutes the desired selective metallization, e.g., the desired electrical circuit.

When form ng the patterned seeding layer, either a subtractive or an additive procedure is used. In the subtractive procedure, an unpatterned seeding layer of, for example, palladium is initially formed on the substrate surface of interest. This is achieved by, for example, sputtering -the seed metal onto the substrate surface. Alternatively, the seed metal is deposited from solution. For example, an unpatterned layer of palladium is readily deposited onto the substrate surface from a solution containing a palladium salt and tin chloride. Once the seed metal is deposited, a layer of photoresist is deposited on the seeding layer, exposed through a mask bearing the pattern of interest and developed. The underlying seeding layer is then etched, e.g., chemically etched, while using the patterned photoresist as an etch mask. Thereafter, the photoresist is chemically stripped, leaving just the patterned seeding layer.

In the additive procedure, a layer of photoresist is initially deposited onto the substrate surface of interest, exposed through a mask and developed. A metal seed, such as palladium, is then deposited onto the substrate surface of interest, while using the patterned photoresist layer as a deposition mask. The patterned photoresist layer (as well as the metal seed deposited onto the photoresist, per se) is then chemically stripped, leaving just the metal seed deposited into the openings in the patterned photoresist layer, which constitutes the patterned seeding layer.

As is known, the use of photoresists and the corresponding chemical developers and strippers is environmentally undesirable. Consequently, attempts have been made to develop methods for forming patterned seeding layers which do not rely on the use of photoresists.

One method for forming a patterned seeding layer which does not rely on the use of a photoresist is described by Thomas H. Baum et al. in "Photoselective Catalysis of Electroless Copper Solutions for the Formation of Adherent Copper Films onto Polyimide," *Chem. Mater.*, Vol. 3, No.4, 1991, pp. 714–720. According to this journal article, a patterned seeding layer of palladium is formed on a surface of a polyimide substrate by immersing the substrate surface in an aqueous seeding solution. This solution includes hydrated forms of potassium trioxalatoferrate ($K_3Fe(C_2O_4)_3$) and tetraamine palladium chloride ($Pd(NH_3)_4Cl_2$). The resulting layer of seeding solution on the substrate surface is then irradiated with UV light through a mask, to photo-selectively deposit palladium metal from the UV-irradiated regions of the solution onto the substrate surface. As a result, a patterned palladium seeding layer is formed without the use of a photoresist. (This patterned seeding layer remains in contact with, and surrounded by, the unexposed regions of the layer of seeding solution.)

According to the Baum et al journal article, immersing a polyimide substrate bearing a patterned palladium seeding layer, produced as described above, in an electroless copper plating bath having a pH of 12 results in deposition of copper just onto the palladium. However, as discussed below, it has been found by the present inventors that subsequent immersion of a second, third, fourth, etc., such polyimide substrate into the same electroless copper plating bath quickly results in serious difficulties. Moreover, these very same difficulties arise when the above-described method of photoselective palladium deposition is applied to other organic substrates, such as the epoxy resin/fiberglass substrates and fluoropolymer-containing substrates used in printed circuit board manufacture. Further, these same difficulties arise when the above-described method of photoselective palladium deposition is applied to inorganic, ceramic substrates, such as alumina substrates, aluminum nitride substrates and silicon nitride substrates.

In addition to plating the surface of the printed circuit board, it also is often important to plate the various through-holes and vias that connect one layer of a multilayer circuit board to one or more other layers. The term "through-hole" is used to mean a hole that connects non-adjacent layers. The term "via" is used to mean a hole that connects adjacent layers. In this application the term "through-hole" is used collectively, to designate through-holes and vias.

Current printed circuit board manufacturing techniques employ the use of plated through-holes to make the connection from one layer to another within the same board. Typically, the holes are mechanically drilled, then seeded with appropriate catalyst such that a thin layer of electroless copper is deposited across the entire structure, including the interior of the drilled holes. The board would then be electrolytically plated with additional copper to the desired thickness. In subsequent processing steps, the external layers are personalized by way of subtractive etching of selected areas defined by the imaged photoresist. To prevent etching the plated copper within the through-holes, the photoresist covers (i.e., tents) the holes during this process. With such a process, a small wire (typically 6 mils in width) on one layer gains access to other layers through a large hole (typically 18 mils in diameter or more). Thus, whereas surface area is considered premium on the x-y planes of a circuit board, the z-direction (i.e., the through-holes) are not so well utilized (since typically only one wire is used per through-hole).

SUMMARY OF THE INVENTION

The invention involves the finding described in the parent application that when a patterned seeding layer, e.g., a patterned palladium seeding layer, is formed on a substrate, such as a polyimide substrate, a printed circuit board substrate or a ceramic substrate, using the method described in the Baum et al journal article, and the substrate is then immersed in a metal plating bath, e.g., an electroless copper plating bath, to form a corresponding electrical circuit, that metal is often deposited not just onto the patterned seeding layer. Rather, metal is also deposited on the unexposed regions of the photoactive layer of seeding solution remaining on the substrate surface, and the frequency of this unwanted metal deposition increases as the number of such substrates immersed in the same metal plating bath increases. As a consequence, the electrical circuit formed on the surface of such a substrate exhibits undesirable short circuits. Moreover, it has been found that the metal plating bath into which the substrates are immersed becomes poisoned by the unexposed seeding solution and unstable.

The invention also involves the finding in the parent application that the above-described problems of unwanted metal deposition and bath instability are avoided by removing the unexposed regions of the photoactive layer of seeding solution remaining on the substrate surface, leaving just the patterned seeding layer, before immersing the substrate in a corresponding metal plating bath. This removal is readily achieved by subjecting the exposed and unexposed regions of the photoactive layer of seeding solution to an alkaline solution such as, for example, an aqueous sodium hydroxide solution. During this removal process, essentially no metal is deposited on either the patterned seeding layer or the unexposed regions of the layer of seeding solution.

Significantly, the added step of subjecting the exposed and unexposed regions of the photoactive layer of seeding solution to the above-described alkaline solution achieves an unexpected, advantageous result. That is, if the layer of seeding solution is formed using, for example, potassium trioxalafoterrate and tetraamine palladium chloride, then subjecting the exposed and unexposed regions of the photoactive layer of seeding solution to the above-described alkaline solution not only serves to remove the unexposed regions, but also serves to form an oxidized species of iron, e.g., iron oxyhydroxide (FeOOH), gel around the seed metal, per se. This gel prevents oxidation of the seed metal, and thus permits a substrate bearing a patterned seeding layer to be stored for months before immersion in a metal plating bath. Moreover, this gel quickly expands and becomes very permeable in the metal plating bath when the substrate is immersed in the bath, thereby permitting metal to be readily deposited onto the patterned seeding layer.

The invention further involves the finding in the parent application that, in addition to patterned palladium seeding layers, patterned seeding layers of, for example, platinum (Pt), gold (Au) and silver (Ag) are also readily photoselectively formed on substrates. All such patterned seeding layers are formed, in accordance with the invention, by exposing appropriate photoactive layers of seeding solution to UV light through a mask, and then removing the unexposed regions of these layers, as described above. Significantly, each such photoactive layer of seeding solution has a composition which includes a metal-containing, water-soluble compound and a photoreactive, water-soluble, oxalate compound.

In this invention, the method for selectively plating the surface of a layer of a printed circuit board described in the parent application is adapted for use in plating through-holes or other openings or edges of a printed circuit board. The steps of the method are first, coating a drilled board with photoseed; second, exposing the board with a non-collimated ultraviolet ("UV") expose tool through an artwork designed to have lines and/or pads that overlap the drilled holes, openings, or edges, but do not completely prevent light from penetrating to the interior of the drilled holes; and third, placing the board in an electroless copper plating bath to deposit metal to the desired regions.

Using this method, multiple wires can be passed through one plated through-hole or opening.

DETAILED DESCRIPTION OF PREFERRED EMBODIMENT(S)

Figure 1:
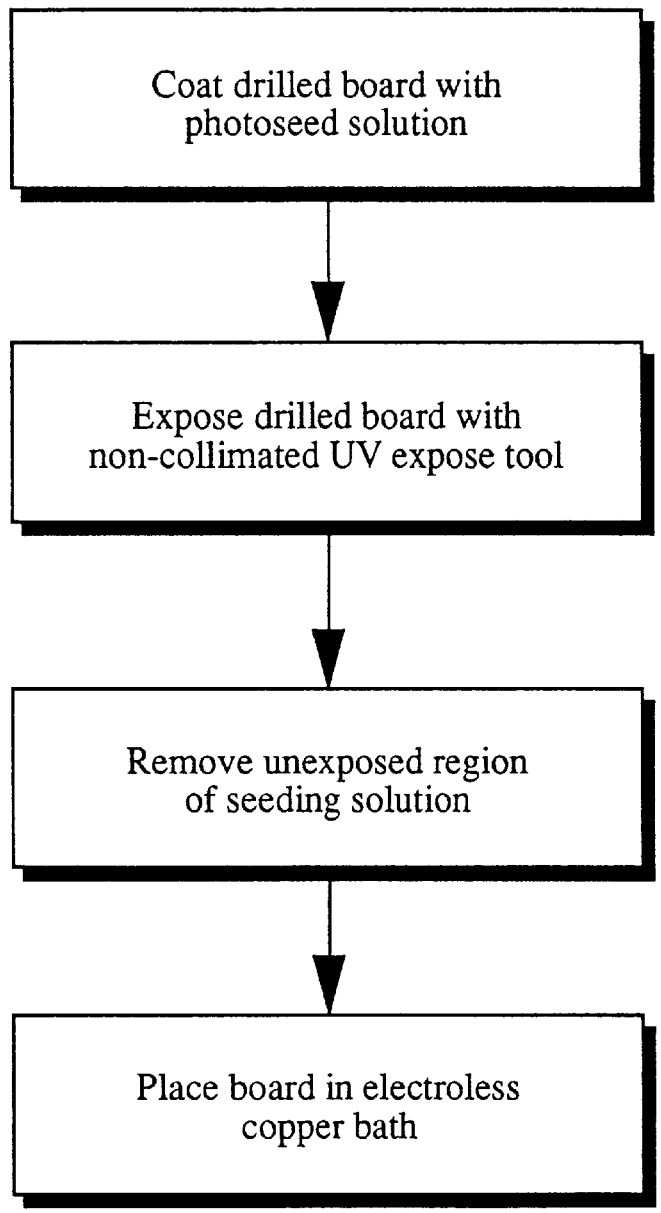
FIG. 1 is a flowchart summarizing the steps in the process of the present application.

The invention involves a method of circuitizing the inside of through-holes, or other openings (such as a slot), or edges of an electronic circuit package. By employing this method, multiple wires can be passed through one through-hole. The invention utilizes a process, described in the parent application, for selectively metallizing, e.g., forming an electrical circuit on, a substrate, such as a printed circuit board substrate, a polyimide substrate or a ceramic substrate. Significantly, this method does not require the use of a photoresist or of the corresponding chemicals needed to develop and strip such a photoresist.

FIG. 1 summarizes the steps in the process described below. In the first step in the process, a patterned metal seeding layer is initially formed on the drilled substrate surface of interest, using the photoselective process described below. Here, the patterned metal seeding layer is preferably of palladium (Pd). Alternatively, the patterned metal seeding layer is of platinum (Pt), gold (Au) or silver (Ag).

According to the photoselective process of the present invention, a bath of seeding solution is first formed, into which the drilled substrate of interest is to be dipped. Alternatively, this bath is used as a source of seeding solution which is spray-coated onto the substrate. Significantly, this seeding solution is an aqueous solution, and has a composition which includes a metal-containing, water-soluble compound and a photoreactive, water-soluble, oxalate compound. (For purposes of the present invention, a photoreactive oxalate compound is an oxalate compound which, when impinged by light of appropriate wavelength, undergoes a reaction with the metal-containing compound, during which the metal ion in the metal-containing compound is reduced to the corresponding base metal.)

The metal-containing, water-soluble compound, referred to above, has the general chemical formula $ML_mX_n$, where M denotes a metal cation, L is a nitrogen-containing, Lewis base ligand, X denotes an anion and m and n denote integers. If the patterned seeding layer is to be of palladium (Pd), platinum (Pt), gold (Au) or silver (Ag), then M denotes $Pd^{(2+)}$, $Pt^{(2+)}$, $Au^{(1+)}$, $Au^{(3+)}$ or $Ag^{(+1)}$. (As is conventional, the superscripts used throughout this disclosure denote oxidation states). The Lewis base ligand, L, is a monodentated or polydentated ligand such as, for example, $NH_3$ or ethylenediamine. The anion, X, is, for example, $F^{(-1)}$, $Cl^{(-1)}$, $Br^{(-1)}$, $(SO_4)^{(-1)}$ or $(NO_3)^{(-1)}$. If, for example, M denotes $Pd^{(2+)}$, then $ML_mX_n$ is preferably $Pd(NH_3)_4Cl_2$, which is just tetraamine palladium chloride, more conventionally written $(NH_3)_4PdCl_2$. Of course, hydrated forms of the above-described metal-containing compound, $ML_mX_n$, are also encompassed by the present invention.

The photoreactive, water-soluble, oxalate compound, referred to above, has the general chemical formula $Y_pM$ $((C_2O_4)_3)_p$, where p denotes an integer. Here, Y denotes, for example, an alkali metal ion, such as $K^{(+1)}$ or $Na^{(+1)}$. Alternatively, Y denotes or includes the quaternary ammonium ion, i.e., $(NH_4)^{(+1)}$. In addition, M denotes either the iron ion, i.e., $Fe^{(+3)}$, or the ruthenium ion, i.e., $Ru^{(+3)}$. If the patterned seeding layer is to be of, for example, palladium, then the photoreactive, water-soluble, oxalate compound is preferably potassium iron oxalate (potassium trioxalatoferrate), i.e., $K_3Fe(C_2O_4)_3$. Hydrated forms of the above-described photoreactive, water-soluble, oxalate compound, $Y_pM((C_2O_4)_3)_p$, are also encompassed by the present invention.

While not essential, the seeding solution bath preferably also includes a surfactant, such as the surfactant sold under the trade name Triton X-100 by the Rohm Haas company of Philadelphia, Pa.

To ensure complete reduction of the metal-containing compound by the photoreactive oxalate compound in a seeding solution bath, the mole ratio of the latter to the former should be at least 8:1, and is preferably 10:1. Keeping this limitation in mind, the concentration of the metal-containing compound in the seeding solution bath ranges from about 4 grams per liter of water (g/L) to about 9.5 g/L, and is preferably about 7 g/L. Concentrations less than about 4 g/L are undesirable because an undesirably small amount of seed metal is deposited onto the corresponding substrates. Concentrations greater than about 9.5 g/L are undesirable because the seeding solution becomes saturated with metal-containing compound at a concentration of about 9.5 g/L, and further additions of such compound are not dissolved in the solution.

The concentration of the photoreactive oxalate compound in the seeding solution bath ranges from about 25 g/L to about 65 g/L, and is preferably about 47 g/L. Concentrations less than about 25 g/L are undesirable because this implies there is insufficient photoreactive material to reduce all the metal in the metal-containing compound. Concentrations greater than about 65 g/L are undesirable because the seeding solution becomes saturated with the oxalate compound at a concentration of about 65 g/L, and further additions of such compound are not dissolved in the solution.

The concentration of the surfactant in the seeding solution bath, if used, ranges from about 0.02 parts per million (ppm) to about 2 ppm, and is preferably about 1 ppm. Concentrations less than about 0.02 ppm are undesirable because they result in poor wetting of the corresponding substrates by the other constituents of the solution. Concentrations greater than about 2 ppm are unnecessary, i.e., they produce no enhanced wetting effect.

When forming the seeding solution bath, the constituents of the bath should be added to the bath container in the following order, to avoid bath instability: (1) add water; (2) add surfactant; (3) add photoreactive oxalate compound, while stirring, until the photoreactive oxalate compound is completely dissolved; and (4) add metal-containing compound, while stirring, until the metal-containing compound is completely dissolved. It should be noted that the above steps should be carried out under, for example, yellow light to avoid decomposition of the photoreactive oxalate compound.

By way of example, if the patterned seeding layer is to be of palladium, and the constituents of the corresponding seeding solution bath include tetraamine palladium chloride, potassium trioxalatoferrate and Triton X-100 surfactant, then a useful (stable) bath is readily formed by initially pouring, for example, 100 mL of water into the bath container. One should then add, for example, two drops of Triton X-100 surfactant to the bath. Then, one should add, for example, 4.7 grams of potassium trioxalatoferrate hydrate to the bath, while stirring, until the potassium trioxalatoferrate hydrate is completely dissolved in the bath. Finally, one should add, for example, 0.7 grams of tetraamine palladium chloride monohydrate to the bath, while stirring, until the latter is completely dissolved in the bath.

It should be noted that the seeding solution bath is preferably continuously filtered, using conventional filter cartridges, e.g., conventional 5 micrometer filter cartridges, to remove particles from the bath. If the photoreactive oxalate compound dissolved in the bath is, for example, potassium trioxalatoferrate, then these particles are typically iron-containing particles, such as iron olxide particles. It is believed that these particles form in the bath because the oxalate compound is sensitive to light, and the bath is unavoidably exposed to light. These particles are undesirable and are removed to prevent these particles from being deposited onto substrates immersed in the bath. In addition, an excessive concentration of these particles may cause the bath to become unstable.

Once the seeding solution bath is formed, the drilled substrate of interest is immersed in the bath to form a photoactive layer of seeding solution on the substrate surface of interest. The thickness of this layer ranges from about 20 Angstroms to about 60 Angstroms, and is preferably about 40 Angstroms. Thicknesses less than about 20 Angstroms are undesirable because the resulting seed metal coverage is incomplete and the seed metal has an undesirably large number of pinholes. Thicknesses greater than about 60 Angstroms are unnecessary because they provide no advantage.

In the second step in the process, ultraviolet (UV) light, i.e., light having a wavelength ranging from about 200 nanometers (nm) to about 450 nm, and preferably about 300 nm to about 450 nm, is now shined onto the photoactive layer of seeding solution through a mask. A useful source of such UV light is, for example, UV lamp Model 161B sold by the Tamarak Scientific company of Anaheim, Calif. As discussed above, shining such UV light onto the seeding solution results in a photoinduced reaction in which metal, e.g., palladium, is formed on regions of the substrate surface corresponding to the exposed regions of the photoactive layer of seeding solution. The intensity of the UV light impinged upon the layer of seeding solution ranges from about 20 millijoules per square centimeter ($mJ/cm^2$) to about 180 $mJ/cm^2$, and is preferably about 65 $mJ/cm^2$. Intensities less than about 20 $mJ/cm^2$ are undesirable because less than all of the metal-containing compound reacts with the oxalate compound. Intensities greater than about 180 $mJ/cm^2$ are undesirable because an intermediate product formed during the reaction between the oxalate compound and the metal-containing compound is decomposed, resulting in the formation of an undesirable oxide, e.g., iron oxide, which is deposited onto the corresponding substrate. significantly, metal, e.g., copper, will not plate onto this oxide.

In connection with the reaction between the metal-containing compound and the oxalate compound, it is believed that the impingement of UV light results in the formation of an oxalate radical, which serves to reduce the metal ion in the metal-containing compound to base metal.

The artwork through which the UV expose tool is shone is designed to have lines and/or pads that may partially overlap the drilled through-holes or other openings, or edges of the substrate but do not completely prevent light from penetrating to the interior of the drilled holes. The light, thus, results in plated through-holes, openings, or edges.

Having photoselectively formed a patterned seeding layer on the drilled substrate surface of interest, the unexposed regions of the photoactive layer of seeding solution, which still contact and surround the patterned seeding layer, are now removed for the reasons discussed above. This is achieved, in accordance with the invention, by immersing the substrate in an alkaline solution, such as an aqueous sodium hydroxide solution. Significantly, the pH of this alkaline solution should be at least about 14, while the temperature of the alkaline solution should range from about 40° C. to about 55° C. Temperatures and pHs less than about 40° C. and about 14, respectively, are undesirable because the corresponding solutions do not serve to remove all of the unexposed regions of a seeding solution and they yield undesirably small amounts of, for example, oxidized iron gel. Temperatures greater than about 55° C. are undesirable because the corresponding solutions serve to remove both the exposed and unexposed regions of a seeding solution.

By way of example, a useful alkaline solution is one which is an aqueous sodium hydroxide solution, in which the concentration of sodium hydroxide is, for example, 2M and the temperature of the solution is 55° C.

It should be noted that in the case of polyimide substrates, the above-described alkaline solution need not be heated to temperatures above room temperature (about 25° C.). That is, the surfaces of polyimide substrates tend to be so smooth that the unexposed regions of the corresponding photoactive layers of seeding solution are readily removed by using alkaline solutions maintained at room temperature.

As noted above, using an alkaline solution to remove the unexposed regions of a layer of seeding solution has the unexpected, advantageous result of also forming a gel of an oxidized species of iron or ruthenium, e.g., iron oxyhydroxide or ruthenium oxyhydroxide, around the seed metal. This gel is advantageous because it prevents oxidation of the seed metal, and thus permits the corresponding substrate to be stored for months before immersion in a metal plating bath. Moreover, upon immersion in a metal plating bath, the gel expands and becomes very permeable in such a bath to permit deposition of metal onto the seed metal. The amount of gel, in relation to the amount of plated metal and seed metal, is extremely small and has no discernable effect on the utility of the plated metal. By contrast, if an acidic solution were to be used to remove the unexposed regions of a photoactive layer of seeding solution, then it has been found that such a removal process necessarily results in the oxidation of the seed metal. This is highly disadvantageous because essentially no metal will be deposited onto the oxidized seed metal when the corresponding substrate is immersed in a metal plating bath. Further, such an acidic solution removes both the exposed and the unexposed regions of the photoactive layer of seeding solution.

In the fourth step of the process, with the removal of the unexposed regions of the layer of seeding solution, as described above, the substrate is now ready for deposition of metal onto the seed metal via, for example, electroless metal plating. In this regard, if the seed metal consists of palladium (Pd), platinum (Pt), gold (Au) or silver (Ag), then it should be noted that a variety of metals are readily deposited onto these seed metals. Included among this variety are copper (Cu), cobalt (Co), nickel (Ni), and gold (Au).

As is known, conventional industrial metal plating baths, e.g., conventional industrial electroless copper plating baths, operate at relatively high temperatures, such as, for example, 72° C. This is disadvantageous because direct immersion of a substrate bearing a patterned seeding layer into such an industrial metal plating bath will result in the partial or total destruction of the patterned seeding layer. To avoid such destruction, and in accordance with the invention, a substrate bearing a patterned seeding layer is first immersed in a corresponding metal plating bath operating at room temperature (about 25° C.). The purpose of such an immersion is to deposit a relatively thin layer of metal, hereinafter referred to as a strike layer, onto the seeding layer, which serves to protect the seeding layer when the substrate is immersed in an industrial metal plating bath. It should be noted that the thickness of such a strike layer should be at least one (1) micrometer to achieve effective protection of the seeding layer.

With the formation of the strike layer on the patterned seeding layer, the substrate can now be immersed in an industrial metal plating bath to deposit additional metal onto the strike layer.

As noted above, the invention is useful for selectively metallizing a variety of substrates, such as polyimide substrates, printed circuit board substrates and ceramic substrates. Included among the polyimide substrates are those having compositions which include biphenyl tetracarboxylic dianhydride-phenylene diamine (BPDA-PDA) and biphenyl tetracarboxylic dianhydride-oxydianiline (BPDA-ODA). Also included among the polyimide substrates are those having compositions which include pyromellitic dianhydride-oxydianiline (PMDA-ODA). Significantly, in connection with each of these polyimide substrates, it has been found that the adhesion of metal, e.g., copper, deposited onto a patterned seeding layer overlying the surface of a polyimide substrate is substantially increased if the surface is base hydrolyzed before the layer of seeding solution is formed on the polyimide surface. This is readily achieved by immersing the substrate surface into, for example, an aqueous solution of sodium hydroxide and N,N,N',N'-tetrakis (2-hydroxypropyl) ethylenediamine for, for example, 10 to 30 minutes. The concentration of the former preferably ranges from about 2M to about 2.5M, while the concentration of the latter preferably ranges from about 0.05M to about 0.1M. However, while the base hydrolysis of a polyimide substrate enhances metal adhesion, such hydrolysis is undesirable because the polyimide is converted to the disodium salt of the corresponding polyamic acid.

Also in connection with the above-mentioned polyimides, there is a distinction between those having compositions which include BPDA-PDA and BPDA-ODA, and those having compositions which include PMDA-ODA. That is, the former are resistant to attack by hot alkaline baths, i.e., alkaline baths heated to temperatures above room temperature (about 25° C.), whereas the latter are not resistant to such attack. (Of course at sufficiently high temperatures, e.g., at a temperature of 150° C., and/or sufficiently high pH, e.g., a pH of 14, even BPDA-PDA and BPDA-ODA are subject to attack.) Consequently, when the former are immersed in industrial metal plating baths, which are typically alkaline, no adverse consequences follow. However, when the latter are immersed in hot industrial metal plating baths, the areas of the substrates which are not covered by patterned seeding layers may be attacked and thereby converted to the corresponding polyamic acids.

Fortunately, the conversion of polyimide to polyamic acid, resulting from the above-described base hydrolysis process and metal plating process, is readily reversible. That is, in all cases, after plating, the polyimide substrates are readily heated so as to convert any polyamic acids to the corresponding polyimides, using the same procedures and temperatures conventionally used to convert polyamic acids to the corresponding polyimides. Thus, any damage suffered during base hydrolysis and metal plating is easily repairable.

Included among the printed circuit board substrates which are readily selectively metallized via the invention are those which have epoxy resin/fiberglass compositions. In addition, the invention is also useful in connection with printed circuit board substrates having compositions which include fluoropolymers. These include substrates with compositions which include: (1) polytetrafluoro-ethylene (PTFE); (2) copolymers of tetrafluoroethylene and hexafluoropropylene; (3) copolymers of tetrafluoroethylene and perfluoroalkoxyvinyl ether; and (4) copolymers of PTFE and compounds having one or more fluorinated dioxole ring segments. In connection with (4), it should be noted that such substrates often have amorphous structures.

In connection with printed circuit board substrates having compositions which include PTFE and which have undergone densification, it has been found that the surfaces of such substrates often contain undesirable chromium deposits. Such deposits are undesirable because the chromium acts like seed metal, causing metal, e.g., copper, to be plated where no such plating is desired. Significantly, it has been found that such chromium deposits are readily removed, prior to the formation of a photoactive layer of seeding solution, by immersing the substrate in an aqueous, sodium persulfate/sulfuric acid solution. One such useful solution is formed by dissolving 25 grams of sodium persulfate and 5 milliliters of sulfuric acid in 100 milliliters of deionized water. The corresponding immersion time should be about 2 minutes.

Included among the ceramic substrates which are readily selectively metallized via the invention are those having alumina compositions, aluminum nitride compositions and silicon nitride compositions.

EXAMPLE 1

An epoxy resin/fiberglass (commonly referred to in the trade as FR-4) printed circuit board substrate was immersed for 30 seconds in a bath of alkaline cleaner/degreaser sold under the. trade name K2 by the Pennwalt Corporation of Cornweld Heights, Pennsylvania. This substrate was then rinsed with deionized water for 2 minutes, immersed for 10 seconds in a 10% sulfuric acid bath to neutralize the alkalinity of the K2 bath, and again rinsed with deionized water for 2 minutes.

A bath of palladium seeding solution was prepared by initially pouring 100 mL of water into a bath container and then adding 2 drops of Triton X-100 surfactant to the bath. Thereafter, 4.7 grams of potassium trioxalatoferrate hydrate was added to the bath, while stirring, until the potassium trioxalatoferrate hydrate was completely dissolved. Finally, 0.7 grams of tetraamine palladium chloride monohydrate was added to the bath, while stirring, until the tetraamine palladium chloride monohydrate was complete dissolved.

The epoxy resin/fiberglass substrate was immersed in the above-described palladium seeding solution bath for 5 minutes. During this immersion, the bath was continuously filtered through a 5 micrometer filter cartridge. Upon removal from this bath, the substrate was air-dried with a so-called air knife.

The substrate was exposed to UV light, through a mask, using a Tamarak Model 161B lamp to achieve photoselective seeding. The intensity of the UV light which impinged upon the substrate was 62 mJ/cm$^2$. The exposure time was 10 seconds.

After the photoselective seeding step, the unexposed regions of the layer of seeding solution on the substrate were removed by immersing the substrate for 2 minutes in a 2M sodium hydroxide bath, maintained at 50–55° C.

Upon removal from the sodium hydroxide bath, the substrate was rinsed with deionized water for 2 minutes, immersed in 10% sulfuric acid for 10 seconds, and then once again rinsed with deionized water for 1 minute.

The substrate was immersed in a conventional, electroless copper plating bath, maintained at a room temperature (about 25° C.), for 15 minutes. As a result, a strike layer of copper, having a thickness of 10 micrometers, was formed on the patterned palladium seeding layer. Thereafter, the substrate was immersed in a conventional, industrial electroless copper plating bath.

Optical inspection of the substrate under a microscope showed that copper had deposited only onto the patterned palladium seeding layer, and nowhere else. The copper adhesion was very good.

EXAMPLE 2

A PTFE, Model 2800 printed circuit board substrate, purchased from the Rogers Corporation of Rogers, Connecticut, was initially densified using a copper foil which contained a chromium oxide. This substrate was then treated with a conventional HCl solution to remove the copper foil. Thereafter, the substrate was initially cleaned with an aqueous, sodium persulfate/sulfuric acid solution, described above, for 2 minutes, to remove-chromium deposits. Finally, with the exception of the immersion in the K2 cleaner, this substrate was subjected to the same processing steps as those described in Example 1. The results were the same as those achieved in Example 1.

EXAMPLE 3

A PMDA-ODA polyimide film, sold under the trade name Kapton by the DuPont company, was initially base hydrolyzed by being immersed, for 10 minutes, in the above-described alkaline solution containing sodium hydroxide and N,N,N',N'-tetrakis (2-hydroxypropyl) ehtylenediamine. A layer of seeding solution was then formed on the modified polyimide film by immersing the film for 10 minutes, in a solution containing potassium trioxalatoferrate and tetraamine palladium chloride.

A patterned palladium seeding layer was formed on the polyimide film by exposing the film to UV light through a mask. The unexposed regions of the layer of seeding solution were removed by immersing the film in an aqueous, 2M, sodium hydroxide solution maintained at room temperature.

The polyimide film was immersed in an electroless copper plating bath, operated at room temperature, for no more than 10 minutes to form a strike layer of copper on the patterned palladium seeding layer. The polyimide film was then immersed in a hot, industrial electroless copper plating bath in order to deposit additional copper onto the strike layer. Thereafter, the polyimide film was heated to 300° C. to imidize any polyamic acid which may have formed during the initial base hydrolysis and subsequent immersion in the industrial electroless copper plating bath.

Optical inspection of the polyimide film under a microscope showed that copper had deposited only onto the patterned palladium seeding layer, and nowhere else. The copper adhesion was very good.

EXAMPLE 4

A thin film of BPDA-PDA was spin coated onto a silicon wafer and heated to drive off the casting solvent and to cure the film to the polyimide structure. This film was base hydrolyzed by immersing the film, for 10 minutes, in the above-described alkaline solution containing hydroxide and N,N,N',N'-tetrakis (2-hydroxypropyl) ethylenediamine. A layer of seeding solution was then formed on the polyimide film by immersing the film, for 30 minutes, in a solution containing potassium trioxalatoferrate and tetraamine palladium chloride.

A patterned palladium seeding layer was formed on the polyimide film by exposing the layer of seeding solution to UV light through a mask. The unexposed regions of the layer of seeding solution were removed by immersing the film in an aqueous, 2M, sodium hydroxide solution maintained at room temperature.

The polyimide film was immersed in an electroless copper plating bath, operated at room temperature, in order to form a strike layer of copper on the patterned palladium seeding layer. Thereafter, the polyimide film was immersed in an industrial electroless copper plating bath in order to deposit additional copper onto the strike layer. Thereafter, the polyimide film was heated to 300° C. to imidize any polyamic acid which may have formed during the initial base hydrolysis. The results were the same as those achieved in Example 3.

Of key importance to the above described method is the use of a non-collimated expose tool to direct UV radiation such that the UV light penetrates to the interior of drilled through-holes. The UV light activates electroless plating and, thus, the interior of the drilled hole or other opening can be circuitized in the z-direction. This allows many lines to penetrate the through-hole, rather than the traditional one wire per hole. Such a technique reduces the number of drilled holes necessary for an intended application.

The number of wires that can be made to pass through a hole depends upon the aspect ratio of the hole and the feature size on the artwork. Typically, one would expect two to four wires per hole, however, this number may be increased for thinner wires.

While the invention has been particularly shown and described with reference to preferred embodiments thereof, it will be understood by those skilled in the art that various changes in form and details may be made therein without departing from the spirit and scope of the invention.

We claim:

1. An electronic circuit package comprising:

a substrate;

one or more drilled through-holes or other openings in the substrate;

metallization of at least one of the one or more drilled through-holes or other openings by the steps of:
  forming a layer of solution on a surface of the drilled substrate, the solution having a composition which includes
    (i) a first metal-containing compound with the general chemical formula $ML_mX_n$, where M denotes a metal cation, L is a Lewis base ligand and X denotes an anion, and m and n denote integers; and
    (ii) a photoreactive oxalate compound with the general chemical formula $Y_pM((C_2O_4)3)_p$ and p denotes an integer;
  exposing selected regions of the layer to light, whereby the exposed form of the oxalate compound acts as a reducing agent to thereby form the first metal on regions of the drilled substrate corresponding to the selected regions of the layer; and
  removing unexposed regions of the layer from the drilled substrate while depositing essentially no metal onto either the first metal or the unexposed regions of one or more wires passing through at least one of the one or more drilled through-holes or other openings.

2. The electronic circuit package of claim 1 wherein M is selected from the group consisting of $Pd^{(2+)}$, $Pt^{(2+)}$, $Au^{(1+)}$, $Au^{(3+)}$ and $Ag^{(1+)}$.

3. the electronic circuit package of claim 1 wherein L is a nitrogen-containing ligand.

4. The electronic circuit package of claim 3 wherein L is selected from the group consisting of $NH_3$ and ethylenediamine.

5. The electronic circuit package of claim 1 wherein X is selected from the group consisting of $F^{(-1)}$, $Cl^{(-1)}$, $Br^{(-1)}$, $(SO_4)^{(-2)}$ and $(NO_3)^{(-1)}$.

6. The electronic circuit package of claim 1 wherein Y is an alkali metal ion.

7. The electronic circuit package of claim 1 wherein Y is selected from the group consisting of $K^{(+1)}$, $Na^{(+1)}$ and $(NH_4)^{(+1)}$.

8. The electronic circuit package of claim 1 wherein M is $Fe^{(+3)}$ and $Ru^{(+3)}$.

9. The electronic circuit package of claim 1 wherein the substrate has a composition which includes epoxy resin.

10. The electronic circuit package of claim 1 wherein the substrate has a composition which includes fluoropolymer.

11. The electronic circuit package of claim 10 wherein the fluoropolymer is polytetrafluoroethylene.

12. The electronic circuit package of claim 10 wherein the fluoropolymer is a copolymer of tetrafluoroethylene and hexafluoropropylene.

13. The electronic circuit package of claim 10 wherein the fluoropolymer is a copolymer of tetrafluoroethylene and perfluoroalkoxyvinyl ether.

14. The electronic circuit package of claim 10 wherein the fluoropolymer is amorphous fluoropolymer and is a copolymer of polytetrafluoroethylene and a compound having a fluorinated dioxole ring segment.

15. The electronic circuit package of claim 10 wherein the substrate has a composition which includes polyimide.

16. The electronic circuit package of claim 15 wherein the polyimide has a composition which includes BPDA-PDA.

17. The electronic circuit package of claim 15 wherein the polyimide has a composition which includes BPDA-ODA.

18. The electronic circuit package of claim 15 wherein the polyimide has a composition which includes PMDA-ODA.

19. The electronic circuit package of claim 1 wherein the drilled substrate is a ceramic substrate.

20. The electronic circuit package of claim 19 wherein the ceramic substrate has a composition which includes alumina, aluminum nitride and silicon nitride.

21. The electronic circuit package of claim 1 which comprises removing unexposed regions of the layer by subjecting the layer to an alkaline solution.

22. The electronic circuit package of claim 21 wherein the alkaline solution comprises an aqueous sodium hydroxide solution.

23. The electronic circuit package of claim 1 wherein the oxalate comprises potassium.

* * * * *

UNITED STATES PATENT AND TRADEMARK OFFICE
CERTIFICATE OF CORRECTION

PATENT NO. : 6,194,785 B1
DATED : February 27, 2001
INVENTOR(S) : Logan Lloyd Simpson et al.

It is certified that error appears in the above-identified patent and that said Letters Patent is hereby corrected as shown below:

Column 1,
Line 33, "form ng" should be -- forming --.

Column 12,
Line 6, after "of" insert -- the layer; and --.

Signed and Sealed this

Thirteenth Day of November, 2001

Attest:

*Nicholas P. Godici*

NICHOLAS P. GODICI
*Attesting Officer*   *Acting Director of the United States Patent and Trademark Office*